United States Patent
Sambucco (10) Patent No.: US 9,853,533 B2
(45) Date of Patent: Dec. 26, 2017

(54) CIRCUIT ARRANGEMENT AND METHOD FOR REPRODUCING A CURRENT

(71) Applicant: Infineon Technologies Austria AG, Villach (AT)

(72) Inventor: Adriano Sambucco, Lind Villach (AT)

(73) Assignee: Infineon Technologies Austria AG, Villach (AT)

(*) Notice: Subject to any disclaimer, the term of this patent is extended or adjusted under 35 U.S.C. 154(b) by 290 days.

(21) Appl. No.: 13/870,069

(22) Filed: Apr. 25, 2013

(65) Prior Publication Data

US 2014/0320095 A1   Oct. 30, 2014

(51) Int. Cl.
| | | |
|---|---|---|
| G05F 3/20 | (2006.01) | |
| H02M 1/00 | (2006.01) | |
| G05F 1/46 | (2006.01) | |
| G01R 19/00 | (2006.01) | |

(52) U.S. Cl.
CPC .............. *H02M 1/00* (2013.01); *G05F 1/46* (2013.01); *G01R 19/0092* (2013.01)

(58) Field of Classification Search
CPC . G05F 1/575; G05F 1/56; G05F 1/573; G05F 3/30; G05F 3/262
USPC ....... 323/312, 315, 316, 317, 273, 274, 275, 323/276, 277
See application file for complete search history.

(56) References Cited

U.S. PATENT DOCUMENTS

| | | | | |
|---|---|---|---|---|
| 4,251,743 A | * | 2/1981 | Hareyama | 327/538 |
| 5,220,207 A | * | 6/1993 | Kovalcik et al. | 327/63 |
| 5,815,027 A | * | 9/1998 | Tihanyi et al. | 327/543 |
| 6,765,374 B1 | * | 7/2004 | Yang | G05F 1/575 323/280 |
| 6,861,827 B1 | * | 3/2005 | Yang | G05F 3/262 323/273 |
| 6,977,491 B1 | * | 12/2005 | Caldwell et al. | 323/282 |
| 7,088,082 B2 | * | 8/2006 | Jung | H03F 1/38 323/273 |
| 7,106,042 B1 | * | 9/2006 | Jackson | G05F 3/262 323/275 |
| 7,557,599 B2 | * | 7/2009 | Graf | 324/762.07 |
| 2004/0140845 A1 | * | 7/2004 | Eberlein | G05F 1/575 327/541 |
| 2007/0007934 A1 | * | 1/2007 | Imtiaz | G05F 1/575 323/274 |
| 2008/0191670 A1 | * | 8/2008 | Oddoart | G05F 1/565 323/273 |
| 2009/0033298 A1 | * | 2/2009 | Kleveland | G05F 1/575 323/271 |
| 2010/0156362 A1 | * | 6/2010 | Xie | G05F 1/565 323/273 |
| 2010/0289475 A1 | * | 11/2010 | Lipka | 323/315 |
| 2012/0176112 A1 | * | 7/2012 | Singh et al. | 323/284 |
| 2015/0346750 A1 | * | 12/2015 | Bhattad | G05F 1/575 323/280 |

FOREIGN PATENT DOCUMENTS

DE          19844665 C1       3/2000

* cited by examiner

*Primary Examiner* — Alex Torres-Rivera
(74) *Attorney, Agent, or Firm* — Shumaker & Sieffert, P.A.

(57) ABSTRACT

A circuit arrangement including a first branch, a second branch and a switching feedback structure is provided. The switching feedback structure may be coupled to the first branch and to the second branch. The switching feedback structure may be configured to adjust a current in the second branch to track a current in the first branch.

28 Claims, 5 Drawing Sheets

CIRCUIT ARRANGEMENT AND METHOD FOR REPRODUCING A CURRENT

TECHNICAL FIELD

Various embodiments relate generally to a circuit arrangement and a method for reproducing a current.

BACKGROUND

Some applications require the measurement of electric currents, for example for current control or for overcurrent protection. A large current to be measured may be tracked by a smaller current that is easier to handle. Tracking may for example be implemented by using a feedback loop with an operational amplifier. However, operational amplifiers usually have limited slew rates and limited bandwidths due to the capacitances required for stability. When tracking fast changing larger currents, this may lead to a systematic offset of the smaller current. In the worst case, the smaller current is unable to track the larger current.

SUMMARY

In various embodiments, a circuit arrangement is provided. The circuit arrangement may include a first branch, a second branch and a switching feedback structure. The switching feedback structure may be coupled to the first branch and to the second branch. The switching feedback structure may be configured to adjust a current in the second branch to track a current in the first branch.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number can identify the drawing in which the reference number first appears. The same numbers can be used throughout the drawings to reference like features and components. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
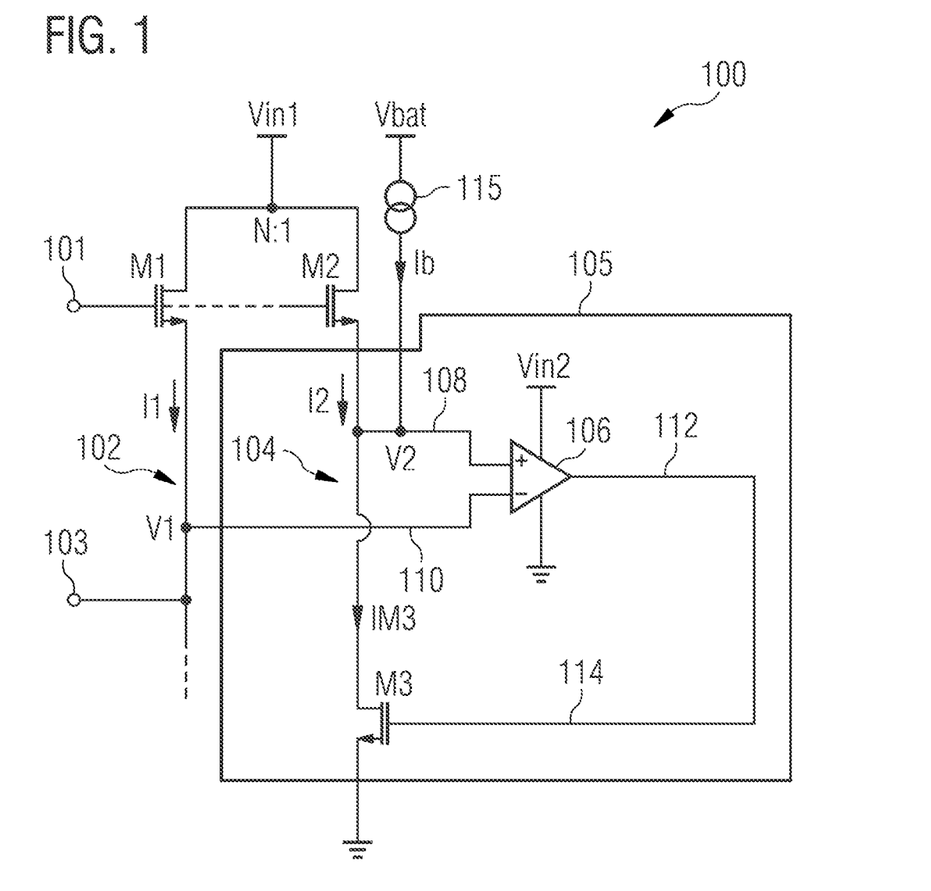
FIG. 1 shows an embodiment of a circuit arrangement.

FIG. 1 shows an embodiment of a circuit arrangement 100. The circuit arrangement 100 may include a first branch 102 and a second branch 104. Both branches 102, 104 may be connected to a common voltage Vin1, which may for example be a supply voltage for the load.

The first branch 102 may be a load current branch. It may carry a current I1, which may be a load current flowing through a load (not shown in FIG. 1). The load may be coupled to a terminal 103. Current I1 may be controlled by a first transistor M1. A first terminal of the first transistor M1 may be coupled to the supply voltage Vin1. A second terminal of the first transistor M1 may be coupled to the load via terminal 103. The first transistor M1 may be a power transistor, for example a power field effect transistor (FET). The power FET may be a power metal-oxide-semiconductor (MOS)FET, for example a diffused MOS (DMOS) or a vertical diffused MOS (VDMOS). The first transistor M1 may form part of the first branch 102. It may be controlled by a signal applied to its gate, for example via terminal 101. The signal may be provided by a driver stage, for example of a power integrated circuit. It may be a digital signal with two states, for example a logic low state and a logic high state. The first transistor M1 may be conducting in one logic state and be non-conducting in the other logic state.

The second branch 104 may be a sense current branch. It may carry a current I2, which may be a sense current. Current I2 may be adjusted by the circuit arrangement 100 to reproduce a current I1 flowing in the first branch 102, that is, it may track or follow the waveform of current I1. Current I2 may be controlled by a second transistor M2. The second transistor M2 may form part of the second branch 104. A first terminal of the second transistor M2 may be coupled to the supply voltage Vin1. The second transistor M2 may be controlled by applying the same signal that is applied to the gate of the first transistor M1 to its gate. The second transistor M2 may also be a FET.

The first transistor M1 and the second transistor M2 may have different aspect ratios. They may differ by a factor N. Factor N may be an integer. It may be in the range of 1,000 to 100,000. It may be in the range of 10,000 to 50,000. It may be approximately 30,000. Factor N may be set by designing the width W to length L ratio W/L of the second transistor M2 to be smaller by a factor N than the width W to length L ratio W/L of the first transistor M1. Because of the different aspect ratios, only a small portion of the current I1 flowing through transistor M1 will flow through the second transistor M2. For example, current I1 may be 30 A and current I2 may be 1 mA.

The circuit arrangement 100 may include a switching feedback structure 105. The switching feedback structure 105 may be coupled to the first branch 102 and to the second branch 104. It may be configured to adjust a current I2 in the second branch 104 to track or follow a current I1 in the first branch 102.

The switching feedback structure 105 may include a comparator 106. A comparator may compare two signals and indicate at its output which of these signals is larger. The comparator 106 may have a positive input 108, a negative input 110 and an output 112. It may be connected to a supply voltage, for example Vin2, and to a reference potential, for example a ground potential. The negative input 110 of the comparator 106 may be coupled to the first branch 102. It may be coupled to the second terminal of the first transistor M1. The positive input 108 may be coupled to the second branch 104. It may be coupled to a second terminal of the second transistor M2.

The comparator 106 may be configured to compare a signal of the first branch 102, such as a first potential V1, and a signal of the second branch 104, such as a second potential V2. The first potential V1 may be the potential of the second terminal of the first transistor M1. The second potential V2 may be the potential of the second terminal of the second transistor M2. The signal at the output 112 of the comparator 106 may be a discontinuous signal. A discontinuous signal may for example have two distinct values and will not remain at any values other than two values. It may have the form of a step function. The signal at the output 112 may have at least two different or discrete states, for example a logic low state and a logic high state. The comparator 106 may output a signal in a logic high state, for example "1", when the potential V2 of the second branch 104 is higher than the potential V1 of the first branch 102. It may output a signal in a logic low state, for example "0", when the potential V2 of the second branch 104 is lower than the potential V1 of the first branch 102.

The switching feedback structure 105 may include a controlled resistance M3. The controlled resistance M3 may have a control input or a control terminal 114 that can control or adjust a resistance between two other terminals. The controlled resistance M3 may be part of the second branch 104. It may be coupled in series with the second transistor M2, for example it may be coupled to the second terminal of the second transistor M2. One terminal of the controlled resistance M3 may be connected to the positive input 108 of the comparator 106 and the other terminal may be connected to a reference potential, for example a ground potential. The controlled resistance M3 may be a transistor. It may have similar dimensions as the second transistor M2.

The output 112 of the comparator 106 may be coupled to the controlled resistance M3, for example to its control terminal 114. The controlled resistance M3 may be configured to control the amount of current I2 flowing in the second branch 104 depending on a signal at an output 112 of the comparator 106. A resistance of the controlled resistance M3 may be reduced when the potential V2 of the second branch 104 is higher than the potential V1 of the first branch 102. The resistance of the controlled resistance M3 may be increased when the potential V2 of the second branch 104 is lower than the potential V1 of the first branch 102. Reducing or increasing the resistance of the controlled resistance M3 may change the current I2 flowing in the second branch 104. Because of the feedback structure, current I2 will be adjusted until the potential V1 and the potential V2 are equal. Since the first transistor M1 and the second transistor M2 are controlled by the same signal applied to terminal 101, the current I2 in the second branch 104 will track the current I1 in the first branch 102. The controlled resistance M3 may be switched by the comparator 106 from one state to another state. The controlled resistance M3 and the comparator 106 may form a switching feedback structure of the circuit arrangement 100.

The circuit arrangement 100 may include a current source 116. It may be coupled to the second branch 104, for example to the positive input 108 of the comparator 106. It may be coupled to a supply voltage, for example Vboot. Vboot may be larger than Vin1. Vboot may be provided by a voltage boost circuit, for example, by a charge pump. Current source 116 may be configured to bias the current I2 flowing in the second branch 104. It may provide a current Ib to flow in the second branch 104. Current Ib may be used to bias current I2, for example by I2=IM3−Ib, where IM3 is a current flowing through the controlled resistance. As a result of the current source 116, a negative current I1, for example, a current I1 flowing from the load through M1 to the supply voltage Vin1, may be measured. A negative current I1 may for example occur when the load includes an inductor. A negative current I1 may be accompanied by a negative current I2 which may be measured because of the biasing due to the current source 116. The current source 116 may be optional, for example, when current I1 does not assume negative values. The operation of the circuit arrangement 100 is described in more detail in conjunction with FIG. 3

Figure 2:
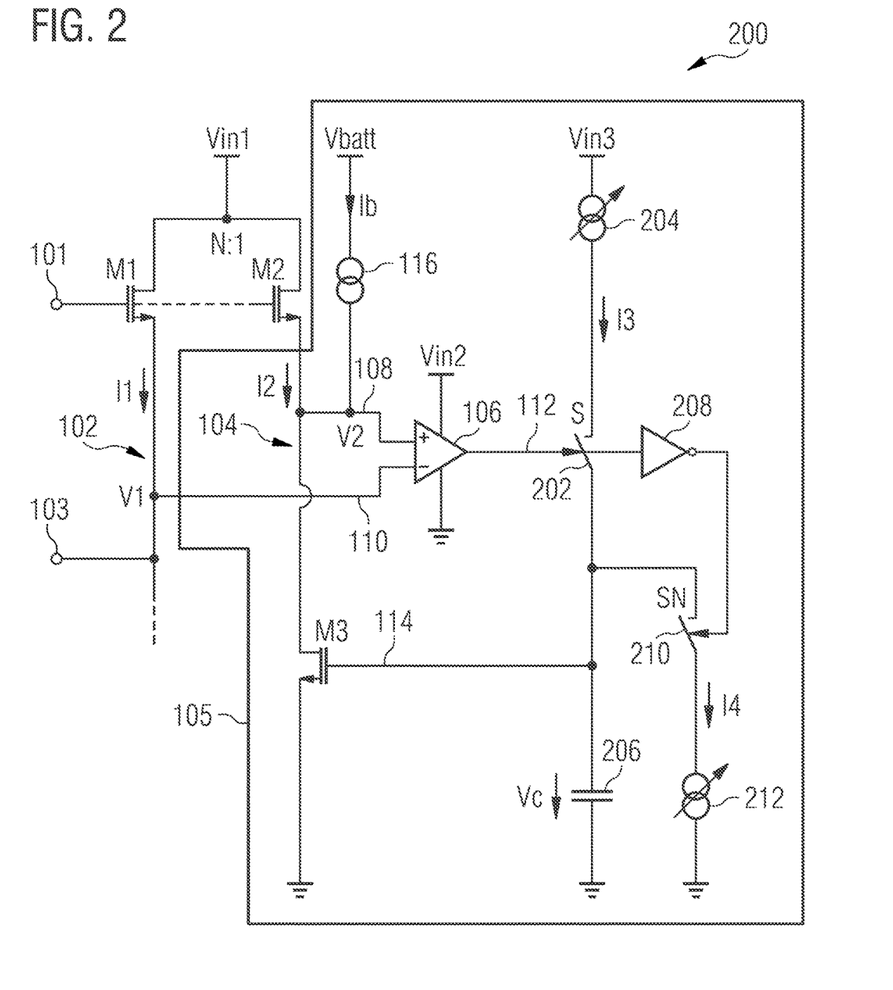
FIG. 2 shows another embodiment of a circuit arrangement.

FIG. 2 shows an embodiment of a circuit arrangement 200. Same parts of the circuit arrangement 200 may correspond to the circuit arrangement 100 of FIG. 1 and will not be described again. In addition to the parts shown in circuit arrangement 100, circuit arrangement 200 may include a first switch 202, a first current source 204, a capacitor 206, an inverter 208, a second switch 210 and a second current source 212.

The first switch 202 may be controlled by a signal S at the output 112 of the comparator 106 which may open or close the first switch 202. The first current source 204 may be coupled with a first terminal to a supply voltage Vin3 and with a second terminal to a first terminal of the first switch 202. The capacitor 206 may be coupled with a first terminal to a second terminal of the first switch 202 and with a second terminal to a reference potential, for example a ground potential. The inverter 208 may be coupled to the output 112 of the comparator 106. It may provide an inverted signal SN of a signal S applied at its input. The second switch 210 may be controlled by the inverted signal SN to open or to close. The second current source 212 may be coupled to a first terminal to a second terminal of the second switch 210 and with a second terminal to a reference potential, for example a ground potential. A first terminal of the second switch 210 may be coupled to the first terminal of the capacitor 206.

In contrast to the circuit arrangement 100 shown in FIG. 1, the output 112 of the comparator 106 is not directly coupled to the controlled resistance M3. Instead, the output 112 of the comparator 106 may be configured to control the charging and discharging of capacitor 206. The first switch 202 may be configured to connect the capacitor 206 to the first current source 204. The first current source 204 may be configured to charge the capacitor 206, for example with a current I3. The second switch 210 may be configured to connect the capacitor 206 to a second current source 212. The second current source 212 may be configured to discharge the capacitor 212, for example with a current I4. Because of the inverter 208, signal S and signal SN may be logically inverted. The second switch 210 may be open when the first switch 202 is closed and the second switch 210 may be closed when the first switch 202 is open.

The voltage Vc across the capacitor 206 may increase over time when the first switch 202 is closed since the first current source 204 charges the capacitor 206 with current I3. The voltage Vc across the capacitor 206 will decrease over time when the second switch 210 is closed and the second current source 212 discharges the capacitor 206 with current I4. The capacitor 206 may be coupled to the control input 114 of the controlled resistor M3, which may for example be a transistor. In contrast to an operational amplifier, in which capacitors are charged and discharged with a very weak current, the first current source 204 and the second current source 212 may be chosen to provide large currents I3, I4 so that the capacitor 206 may be quickly charged and discharged. the controlled resistor M3 may therefore adjust the current I2 flowing in the second branch 104 quickly enough to track any changes in the current I1 flowing in the first branch 102.

In an embodiment, the capacitor may be part of the controlled resistor M3, for example, be part of a transistor. The capacitor may be formed by a gate-source of the transistor M3. In such an embodiment, a separate capacitance 206 as shown in FIG. 2 is not necessary.

In an embodiment, the signal at the output 112 of the comparator 106 may provide currents large enough for the capacitor 206 to be charged and discharged fast enough for current I2 in the second branch 104 to track current I1 in the first branch 102. In this case, the first current source 204, the second current source 212, the inverter 208 and the switch 202 are not necessary. An example of such an embodiment is illustrated in FIG. 1.

Figure 4:
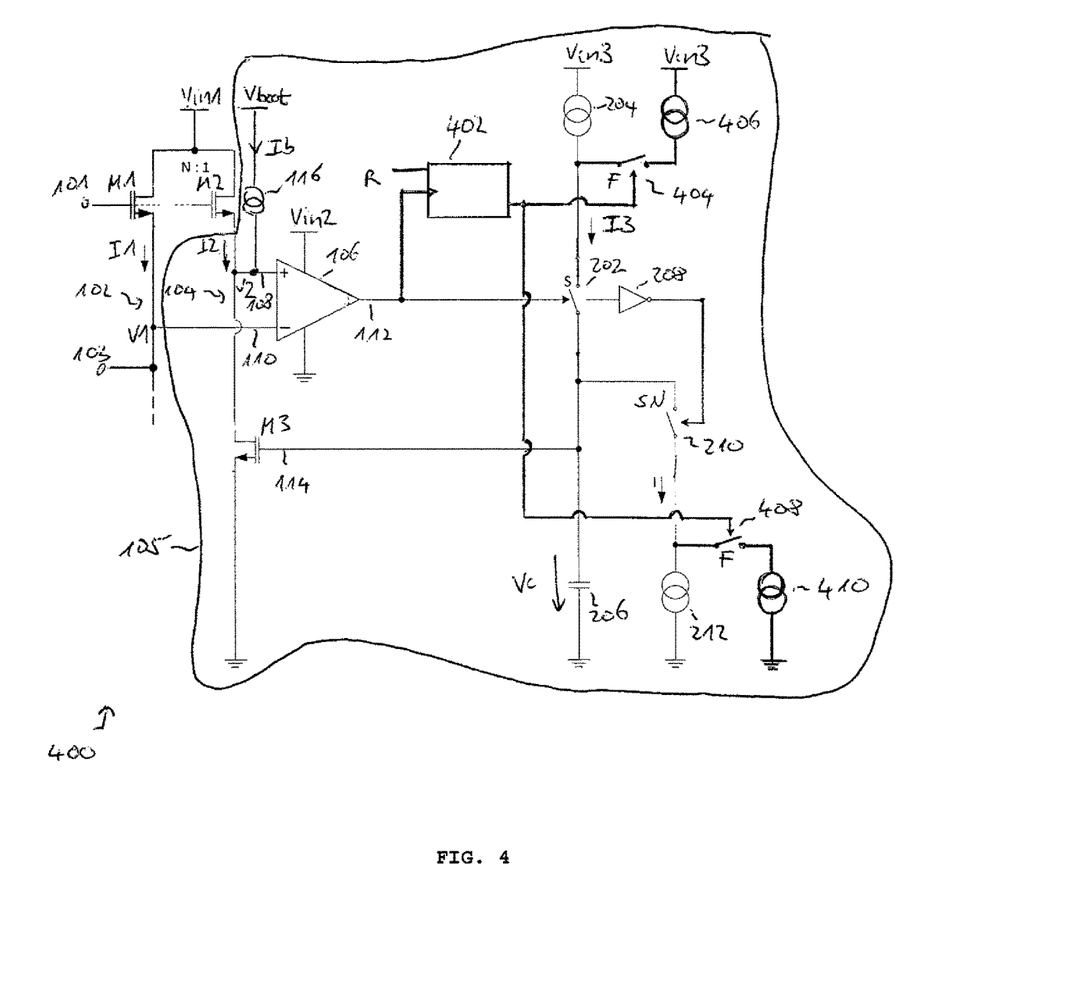
FIG. 4 shows an embodiment of a still another circuit arrangement.

In an embodiment, the current I3 of the first current source 204 may be variable. In an embodiment, the current I4 of the second current source 212 may be variable. Examples of such embodiments are shown in FIG. 4.

In an embodiment, the second current source 212 is not necessary. Instead, the capacitor 206 may be discharged by shortening it, for example by closing the second switch 210, which may have its second terminal connected to the same reference potential as the capacitor 206.

Figure 3:
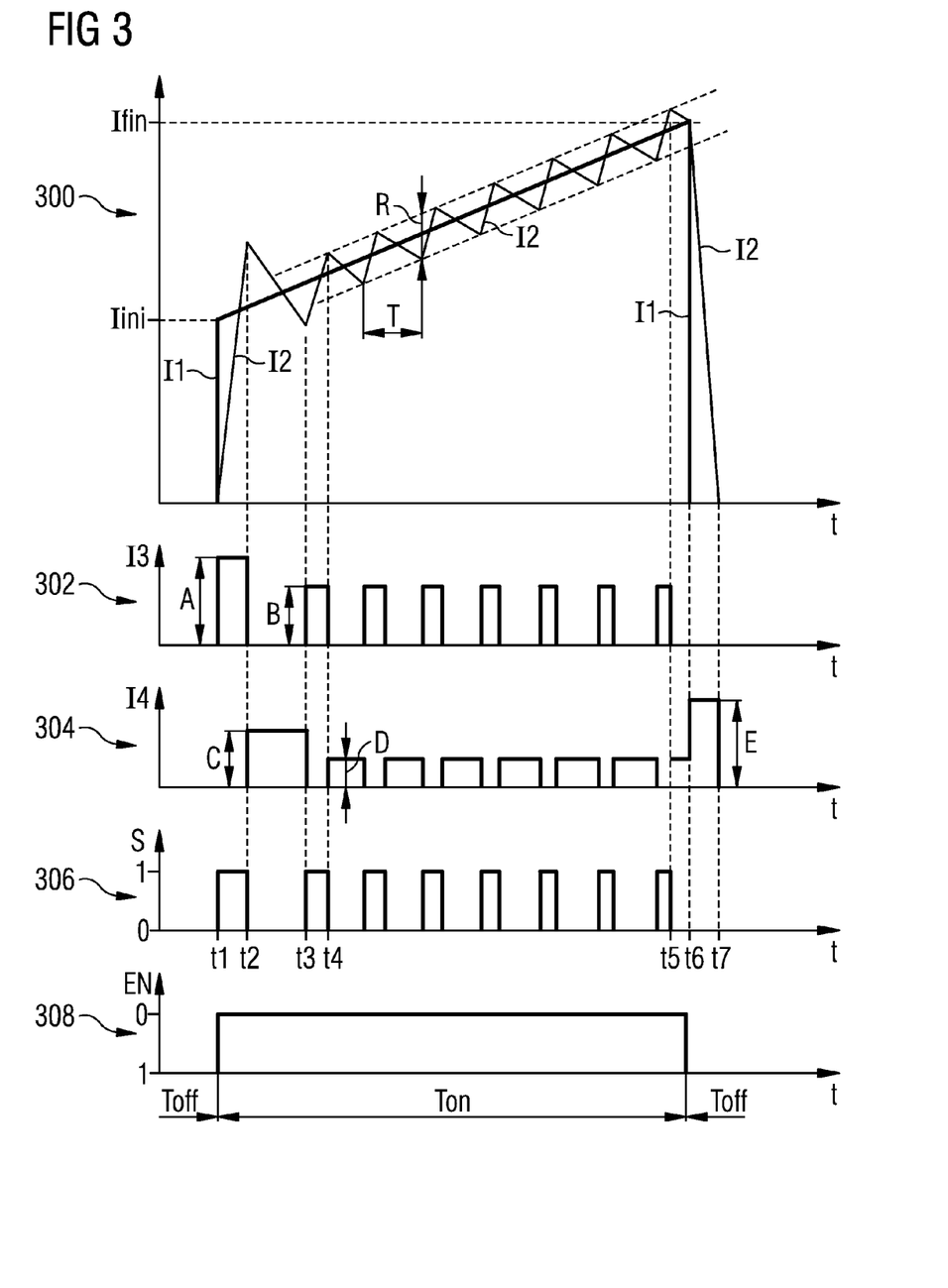
FIG. 3 shows signals in an embodiment of a circuit arrangement.

FIG. 3 shows signals of embodiments of a circuit arrangement in diagrams 300, 302, 304, 306 and 308. Diagram 300 shows the first current I1 and the second current I2 over time t. Diagram 302 shows the current I3 of the first current source 204 over time t, while diagram 304 shows the current I4 of the second current source 212 over time t. Diagram 306 shows the signal S at the output 112 of the comparator 106, while diagram 308 shows an enable signal EN of the comparator 106.

Initially, before time t1, a signal may be provided to the gate of the first transistor M1, for example via terminal 101, so that the first transistor M1 is non-conducting. The period in which no current I1 is flowing is indicated by Toff. The signal provided to the gate of the first transistor M1 may be used as an enable signal EN for the comparator 106. The first switch 202 and the second switch 210 may be open. No current I3 and current I4 I is flowing. Signal S at the output 112 of the comparator 106 may have a low value ("0"). The voltage Vc across capacitor 206 may be zero.

At time t1, a signal may be provided to the gate of the first transistor M1, for example via terminal 101, so that the first transistor M1 may be conducting. The signal may be provided for a period Ton. Current I1 may increase quickly to an initial value Iini and may continue to increase to a final value Ifin at time t6. At time t6, a signal may be provided to the gate of the first transistor M1, so that the first transistor M1 becomes non-conducting again, starting another period Toff. Current I1 may drop sharply to zero.

With the increase in current I1, the potential V1 of the first branch 102 may drop below the potential V2 of the second branch 104. Since the potential at the positive input 108 of the comparator 106 is greater than the potential at the negative input 110 of the comparator 106, the comparator 106 may generate at its output 112 a signal S with a high value. Signal S may close the first switch 202 and may connect the first current source 204 to the capacitor 206. Current I3 may have an amplitude A and may charge the capacitor 206. Charging the capacitor 206 may increase its voltage Vc which may control the controlled resistance M3. With an increase in voltage Vc, the resistance of the controlled resistance M3 may be reduced, allowing the flow of a current I2 through the second branch 104.

With the increase in current I2, the potential V2 of the second branch 102 may drop to the potential V1 of the first branch 102, for example at time t2. Since the potential at the positive input 108 of the comparator 106 is no longer greater than the potential at the negative input 110 of the comparator 106, comparator 106 may generate at its output 112 a signal S with a low value "0". Signal S may open the first switch 202 and may disconnect the first current source 204 from the capacitor 206. At the same time, signal SN which may correspond to the inverted signal S, may close the second switch 210 and may connect the second current source 212 to the capacitor 206. The second current source 212 may discharge capacitor 206 with a current I4, which may have an amplitude C. Discharging capacitor 206 may decrease its voltage Vc which may control the controlled resistance M3. The resistance of the controlled resistance M3 may increase with a decrease in voltage Vc, thus reducing the flow of current I2 through the second branch 104.

With the decrease in current I2, the potential V2 of the second branch 104 may start to rise again and may at time t3 be equal to the potential V1 of the first branch 102. When the potential at the positive input 108 of the comparator 106 is equal or greater than the potential at the negative input 110 of the comparator 106, the comparator may again generate at its output 112 a signal S with a high value "1". Signal S may again close the first switch 202 and may connect the first current source 204 to the capacitor 206. At about the same time, signal SN may open the second switch 210 and may disconnect the second current source 212 from the capacitor 206. Current I3 may again charge the capacitor 206. Current I3 may have an amplitude B which is smaller than amplitude A. However, amplitude A and amplitude B may also be the same.

Charging the capacitor 206 may again increase its voltage Vc which may control the controlled resistance M3. With an increase in voltage Vc, the resistance of the controlled resistance M3 may be reduced, allowing more current I2 to flow through the second branch 104. The potential V2 of the second branch 102 may again drop to the potential V1 of the first branch 102, for example at time t4. Since the potential V2 at the positive input 108 of the comparator 106 is no longer greater than the potential V1 at the negative input 110 of the comparator 106, comparator 106 may again generate at its output 112 a signal S with a low value "0". Signal S may open the first switch 202 and may disconnect the first current source 204 from the capacitor 206. At the same time, signal SN, which may correspond to an inverted signal S, may again close the second switch 212 and may connect the second current source 212 to the capacitor 206. The second current source 212 may discharge capacitor 206 with a current I4, which may have an amplitude D. Amplitude D may be smaller than amplitude C. However, amplitude D may be the same as amplitude C. FIG. 4 shows an embodiment of a circuit arrangement 400 in which the amplitude of current I4 can be switched between two amplitudes.

Discharging capacitor 206 may decrease its voltage Vc which may control the controlled resistance M3 to increase its resistance, thus reducing the flow of current I2 through the second branch 104.

The charging and discharging of capacitor 206 may continue up to a time t6, at which current I1 may be turned off, for example by applying a signal to the input 102 of the first transistor M1. Diagram 300 shows how current I2 tracks current I1. The waveform of current I1 flowing in the first branch 102 may thus be reproduced in a second branch 104. The potential V1 of the first branch 102 may act as a moving reference voltage for the comparator 106. Current I2 may oscillate about the actual value of current I1. The oscillation is due to the switching character of the feedback structure. The circuit arrangement switches between a first state and a second state. The first state may for example be a charging state and the second state may for example be a discharging state. The switching may be triggered by the discontinuous signal at the output 112 of the comparator 106. The discontinuous signal may be used to directly control the controlled resistance M3, as is shown in FIG. 1, or may be used to control the charging and discharging of the capacitor 206, as is shown in FIG. 2. The switching feedback structure may be described as a bang-bang controller, an on-off controller, a digital or a binary controller and may provide a method for tracking current I1 at a high speed.

In steady-state, the oscillation of current I2 may have an amplitude R and a period T. The amplitude R and the period T of current I2 may depend on the rate of increase and decrease of current I2 over time t, the maximum switching speed of the technology used for implementing the circuit arrangement and on any hysteresis the comparator 106 may have. The time needed for charging and discharging capacitor 206 may depend on its capacitance and the current I3 provided by the first current source 204 and the current I4 provided by the second current source 212, respectively. As can be seen from the rising slopes of current I2 in diagram 300, charging the capacitor 206 with the larger amplitude A of current I3 leads into a faster increase than charging the capacitor 206 with the smaller amplitude B of current I3. Similarly, as can be seen from the falling slopes of current I2 in diagram 300, discharging the capacitor 206 with the larger amplitude C of current I4 leads into a faster discharge then discharging it with the smaller amplitude D of current I4.

The tracking speed may be increased by increasing the amplitudes of current I3 and I4. However, increasing the amplitudes may also lead to a larger amplitude R of the oscillation which may influence the accuracy of the current sensing. Depending on the application, the circuit arrangement may be designed that at the start of tracking current I1 large charge currents I3 and large discharge currents I4 are used so that current I2 may quickly reach a region which corresponds to current I1. After reaching an approximate value of current I2, the charge current I3 and discharge current I4 may be reduced to reduce the amplitude R of the oscillation. The charge current I3 and discharge current I4 may be varied, for example after a predetermined time period or after counting a predetermined number of oscillations, as is described in the embodiment shown in FIG. 4. The discharging current I4 may also be increased after the first transistor M1 is switched off, for example at time t6. By varying the charge current I3 and the discharge current I4 as described above, it is possible to achieve a fast tracking and to reduce the amplitude R of the oscillation.

FIG. 4 shows an embodiment of a circuit arrangement 400. Some parts of the circuit arrangement 400 correspond to the circuit arrangement 200 of FIG. 2 and will not be described again. In addition to the parts shown in circuit arrangement 200, the switching feedback structure of circuit arrangement 400 may include a counter 402 The counter 402 may have an input coupled to an output 112 of the comparator 106 and may have an output providing a signal F. The switching feedback structure may include a third current source 406 and a third switch 404. A first terminal of the third current source 406 may be coupled to a supply voltage Vin3, which may be the same supply voltage Vin3 that the first current source 204 is coupled to. However, it can also be a different supply voltage. A second terminal of the third current source 406 may be coupled via the third switch 404 to the second terminal of the first current source 204. The third switch 404 may be configured to connect the third current source 406 in parallel to the first current source 204, thus increasing the current I3 used for charging the capacitor 206. The third switch 404 may be controlled by the signal F output by the counter 402.

The counter 402 may count the number of changes in the signal S at the output 112 of the comparator 106. The change in signal S may for example be a positive or a negative transition of signal S. The counter may to output a signal F after a predetermined number of changes have been counted. For example, the predetermined number of changes may be two, so that signal F may be output after signal S has changed its value twice. Diagram 302 of FIG. 3 shows how current I3 is reduced from an amplitude A to an amplitude B, for example by opening the third switch 304, thus disconnecting the third current source 406 after two positive transitions of signal S. However, depending on the application, a different number of predetermined changes may be used.

The counter 402 may have a reset input R and may be reset by applying a corresponding signal to the reset input R. The reset input R may for example be coupled to the enable signal EN of the comparator 106 or to the signal applied to the terminal 101 of the first transistor M1. The counter 402 may be reset by a rising edge of the signals.

The switching feedback structure may further include a fourth current source 410 and a fourth switch 408. A second terminal of the fourth current source 410 may be coupled to a reference potential, which may be the same reference potential that the second current source 206 is coupled to. However, it can also be a different potential. A first terminal of the fourth current source 408 may be coupled via the fourth switch 408 to the first terminal of the second current source 204. The fourth switch 408 may be configured to connect the fourth current source 410 in parallel to the second current source 212, thus increasing the current I4 used for discharging the capacitor 206.

The fourth switch 410 may be controlled by the signal F output by the counter 402. It may be controlled by the same signal F as the third switch 404. However, it can also be controlled by a signal that is provided after a different number of predetermined number of changes has been counted. Diagram 304 of FIG. 3 shows how current I4 is reduced from an amplitude C to an amplitude D, for example by opening the fourth switch 408 and disconnecting the fourth current source 410, for example after two negative transitions of signal S.

While FIG. 4 shows the use of a counter 402 to determine when current I3 and current I4 at to be reduced, different means of opening the third switch 402 and the fourth switch 408 may be used. For example, they may be opened after a predetermined time delay. Further, different embodiments of changing the currents I3 and I4 are possible, using for example continuously variable current source I3 and I4 instead of switches.

The fourth switch 404 may be closed at time t6, after detecting that a signal is applied to the first transistor M1 to turn it off. The fourth switch 408 may be closed for a predetermined time period or until the voltage Vc across the capacitor 206 is reduced to zero, thereby discharging capacitor 206 by the fourth current source 410. Capacitor 206 may also be discharged by shortening it, for example by closing a switch coupled across it. The switch may be coupled in series with a small resistance to limit the current flowing. It may be operated after detecting that a signal is applied to terminal 101 of the first transistor M1 to turn it off. By varying currents I3 and I4, an fast and accurate tracking of current I1 may be achieved.

Figure 5:
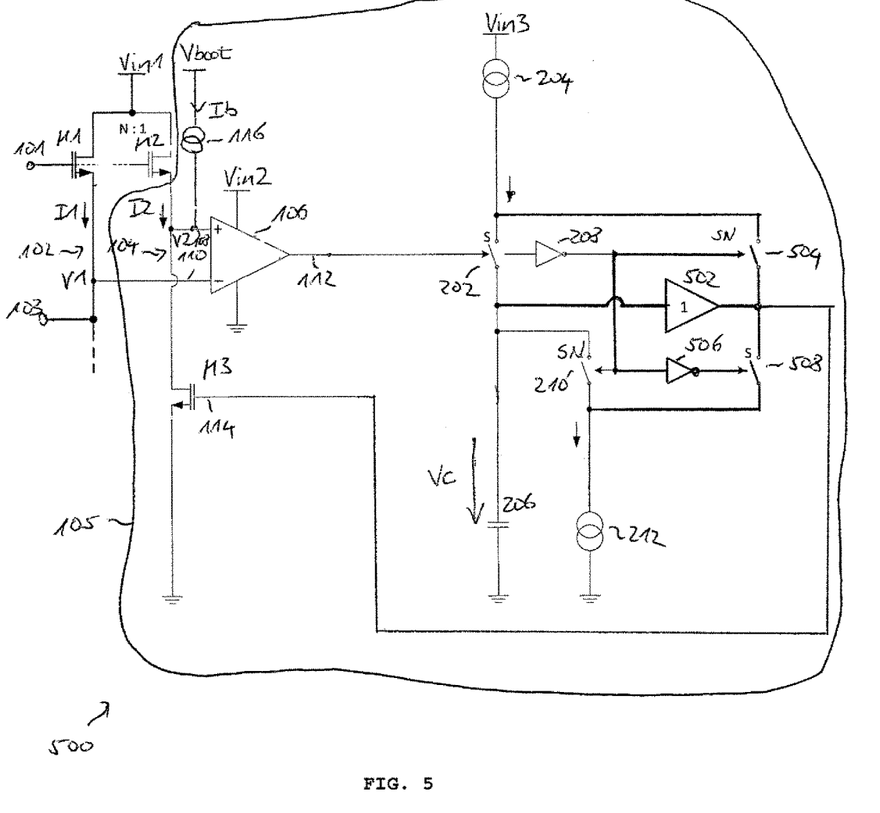
FIG. 5 shows an embodiment of a yet another circuit arrangement.

FIG. 5 shows an embodiment of a circuit arrangement 500. Some parts of the circuit arrangement 500 corresponds to the circuit arrangement 200 of FIG. 2 and will not be described again. In addition to the parts shown in circuit arrangement 200, the switching feedback structure may include a spike suppression circuit. The spike suppression circuit may be configured to provide a potential of the capacitor 206 to the first current source 204 before the first current source 204 is connected to the capacitor 206. The first current source 204 may then be at the same potential as the capacitor 206 so there will be no potential discontinuities when it is connected to a charge the capacitor 206.

The spike suppression circuit may include a voltage buffer 502 and a fifth switch 504. The voltage buffer 502 may have an input and an output. It may be configured to reproduce a voltage at its inputs at its output. It may for example be a voltage follower. The voltage buffer 502 may be coupled to the first current source 204 via a fifth switch 504. A first terminal of the voltage buffer 502 may be connected to the first terminal of the capacitor 206 and a second terminal of the voltage buffer 502 may be connected via the fifth switch 504 to the second terminal of the first current source 204.

The fifth switch 504 may be open when the first switch 202 is closed and may be closed when the first switch 202 is open. This may be achieved by inverting signal S used for operating the first switch 202 and providing the inverted signal SN to operate the fifth switch 504. Signal SN may already be provided by the inverter 208. The first current source 204 will then be at the same potential as the first terminal of the capacitor 206 even though the first switch 202 is open. Consequently, there will be no current spike due to voltage differences when the first current source 204 is connected to the capacitor 206 to charge it.

The spike suppression circuit may be further configured to provide a potential of the capacitor 206 to the second current source 212 before the second current source is connected to the capacitor 206. The first terminal of the second current source 212 may then be at the same potential as the first terminal of the capacitor 206 so there will be no potential discontinuities when it is connected to discharge the capacitor 206. The same voltage buffer 502 may be used for precharging the first current source 204 and the second current source 212. However, a separate voltage buffer may also be used.

The voltage buffer 502 may be coupled to the second current source 212 via a sixth switch 508. The sixth switch 508 may be open when the second switch 210 is closed and may be closed when the second switch 210 is open. This may be achieved by providing signal S used for operating the first switch 202, for example via another inverter 506 connected to the output of the inverter 208. However, the sixth switch 508 may also be operated directly by signal S.

In contrast to FIG. 2, the capacitor 206 it no longer connected to the control input 114 of the controlled resistance M3. Rather, it is connected to the output of the voltage buffer 502, which may provide a low impedance voltage that is equivalent to the capacitor voltage Vc. Compared to a direct connection to the capacitor 206, which may have a high impedance, this may result in faster switching speeds and a better immunity to noise. This may especially be the case when the drain-gate capacitance of transistor M3 is large.

While different embodiments have been described in conjunction with FIGS. 1 to 5, the different embodiments can also be combined with each other. For example, the spike suppression circuit of FIG. 5 can be used with the variable current sources of FIGS. 2 and 4.

The circuit arrangement may be used in all kinds of current control or for overcurrent protection. It may, for example be used in DC-DC voltage converters. The circuit arrangement 100 may be operated at the maximum speed that is offered by the technology used for manufacturing it. The maximum speed is not limited by the capacitors that need to be charged and discharged as in a conventional operational amplifier. Load currents with a frequency of more than 1 MHz and with duty cycles lower than 15% may be tracked. For example, the period Ton during which the load transistor M1 is conduction may be as small as 80 ns.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a first branch and a second branch; and
a switching feedback structure that is coupled to the first branch and to the second branch and that is configured to adjust a current in the second branch to track a current in the first branch, wherein the switching feedback structure comprises a comparator, a controlled resistance, and at least one switch, and wherein:
the comparator includes an inverting input, a non-inverting input, and an output, and is configured to produce a signal at the output based on a potential of the first branch at the inverting input and a potential of the second branch at the non-inverting input, and
the controlled resistance and the at least one switch are connected between the output and the non-inverting input of the comparator in a feedback loop topology for the comparator to force the switching feedback structure to adjust the current in the second branch to track the current in the first branch.

2. The circuit arrangement according to claim 1, wherein the controlled resistance is part of the second branch.

3. The circuit arrangement according to claim 2, wherein an output of the comparator is coupled to a control input of the controlled resistance.

4. The circuit arrangement according to claim 3, wherein the switching feedback structure is configured to reduce a resistance of the controlled resistance when the potential of the first branch is less than the potential of the second branch in magnitude, and to increase the resistance of the controlled resistance when the potential of the first branch is greater than the potential of the second branch in magnitude.

5. The circuit arrangement according to claim 1, wherein a first switch of the at least one switch is configured to connect a capacitor to a first current source, wherein the first current source is configured to charge the capacitor.

6. The circuit arrangement according to claim 5, wherein a second switch of the at least one switch is configured to connect the capacitor to a second current source, wherein the second current source is configured to discharge the capacitor.

7. The circuit arrangement according to claim 6, wherein the switching feedback structure is configured so that the second switch is opened when the first switch is closed and the second switch is closed when the first switch is opened.

8. The circuit arrangement according to claim 5, wherein the switching feedback structure is configured to decrease the current of at least one of the first current source and the second current source after a signal at the output of the comparator has changed to a predetermined number.

9. The circuit arrangement according to claim 8, wherein the switching feedback structure comprises a counter configured to count a number of changes in a signal at the output of the comparator and to output a signal after a predetermined number of changes have been counted.

10. The circuit arrangement according to claim 9, wherein the switching feedback structure comprises a third current source and a third switch configured to connect the third current source in parallel to the first current source, wherein the third switch is controlled by the signal output by the counter.

11. The circuit arrangement according to claim 9, wherein the switching feedback structure comprises a fourth current source and a fourth switch configured to connect the fourth current source in parallel to the second current source, wherein the fourth switch is controlled by the signal output by the counter.

12. The circuit arrangement according to claim 5, wherein the switching feedback structure is configured to decrease a current of at least one of the first current source and a second current source after a predetermined time.

13. The circuit arrangement according to claim 12, wherein the switching feedback structure comprises a spike suppression circuit, the spike suppression circuit comprising a voltage buffer coupled to the first current source via a fifth switch, wherein the spike suppression circuit is configured to open the fifth switch when the first switch is closed and to close the fifth switch when the first switch is opened.

14. The circuit arrangement according to claim 13, wherein the voltage buffer is coupled to the second current source via a sixth switch, wherein the sixth switch is open when the second switch is closed and is closed when the second switch is open.

15. The circuit arrangement according to claim 12, wherein the switching feedback structure comprises a spike suppression circuit, the spike suppression circuit further configured to provide a potential of the capacitor to the second current source before the second current source is connected to the capacitor.

16. The circuit arrangement according to claim 5, wherein the switching feedback structure comprises a spike suppression circuit configured to provide a potential of the capacitor to the first current source before the first current source is connected to the capacitor.

17. The circuit arrangement according to claim 1, further comprising: a current source, wherein the current source is configured to bias the current in the second branch.

18. The circuit arrangement according to claim 1, wherein the first branch is a load current branch and the second branch is a sense current branch.

19. The circuit arrangement of claim 1, wherein the controlled resistance and the at least one switch are configured to be in different positions.

20. The circuit arrangement according to claim 1, further comprising a current source configured to be coupled to the output of the comparator.

21. The circuit arrangement according to claim 20, further comprising a capacitor configured to be coupled to the output of the comparator and the current source, wherein the current source is configured to discharge the capacitor.

22. A circuit arrangement, comprising:
a first branch and a second branch; and
a feedback network that includes a comparator, at least one switch, and a transistor coupled to the at least one switch, wherein the comparator includes an output, an inverting input coupled to the first branch, and a non-inverting input coupled to the second branch such that the transistor and the at least one switch are connected between the output and the non-inverting input of the comparator in a feedback loop for the comparator to force the feedback network to adjust a current in the second branch to track a current in the first branch, and wherein the comparator is configured to produce a signal at the output based on a voltage at the inverting input and a voltage at the non-inverting input to control the at least one switch to charge and discharge a capacitor that is coupled to a control input of the transistor.

23. The circuit arrangement according to claim 22, wherein the capacitor is part of the transistor.

24. The circuit arrangement according to claim 23, wherein the capacitor corresponds to a gate-source of the transistor.

25. The circuit arrangement of claim 22, wherein a terminal of the capacitor coupled to the control input of the transistor is further coupled to the at least one switch.

26. The circuit arrangement of claim 25, wherein a further terminal of the capacitor is configured to be coupled to a reference potential.

27. The circuit arrangement according to claim 22, wherein the current in the second branch is controllable based on a voltage applied at a gate of the transistor.

28. A method for reproducing a first current that is flowing in a first branch, the current being reproduced in a second branch to follow a waveform of the first current in the first branch, comprising:
generating, by a comparator that includes an inverting input, a non-inverting input, and an output, a discontinuous signal at the output with at least two states based on a comparison of a signal of the first branch at the inverting input and a signal of the second branch at the non-inverting input;
adjusting the current in the second branch with a controlled resistance depending on the discontinuous signal until the discontinuous signal changes from a first state of the at least two states into a second state of the at least two states, wherein the controlled resistance is connected between the output and the non-inverting input of the comparator in a feedback loop topology for the comparator to enable the current being reproduced in the second branch to follow the waveform of the first current in the first branch;
charging an energy storage device when the discontinuous signal is in the first state of the at least two states; and
discharging the energy storage device when the discontinuous signal is in the second state of the at least two states.

* * * * *